United States Patent
Barden et al.

(10) Patent No.: US 10,444,285 B2
(45) Date of Patent: Oct. 15, 2019

(54) DIAGNOSTIC CIRCUIT TEST DEVICE

(71) Applicant: Power Probe Tek, LLC, Brea, CA (US)

(72) Inventors: David Barden, Placentia, CA (US); Joshua Carton, Wilmington, CA (US); Wayne Russell, Ontario, CA (US)

(73) Assignee: Power Probe Tek, LLC, Brea, CA (US)

( * ) Notice: Subject to any disclaimer, the term of this patent is extended or adjusted under 35 U.S.C. 154(b) by 0 days.

(21) Appl. No.: 16/113,324

(22) Filed: Aug. 27, 2018

(65) Prior Publication Data

US 2019/0011501 A1 Jan. 10, 2019

Related U.S. Application Data

(63) Continuation of application No. 14/955,557, filed on Dec. 1, 2015, now Pat. No. 10,060,981.
(Continued)

(51) Int. Cl.
*G01R 31/02* (2006.01)
*G01R 31/327* (2006.01)
(Continued)

(52) U.S. Cl.
CPC ..... *G01R 31/3278* (2013.01); *G01R 1/06788* (2013.01); *G01R 15/125* (2013.01);
(Continued)

(58) Field of Classification Search
CPC ............ G01R 31/3278; G01R 31/2886; G01R 31/2889; G01R 31/2831; G01R 31/3686;
(Continued)

(56) References Cited

U.S. PATENT DOCUMENTS 4,056,775 A    11/1977   Milkovic
4,524,321 A *   6/1985   Jablway ............... G01R 31/026
                                                    324/540
(Continued)

OTHER PUBLICATIONS

International Search Report for PCT/US15/53470 dated Mar. 3, 2016.

*Primary Examiner* — Thang X Le
(74) *Attorney, Agent, or Firm* — Rutan & Tucker LLP; Hani Z. Sayed

(57) ABSTRACT

An apparatus is provided for a diagnostic circuit test device having multi-meter functionality and being adapted to provide current sourcing to an electrical system for selective measurement of a plurality of parameters thereof in powered and unpowered states. The diagnostic circuit test device comprises a conductive probe element configured to be placed into contact with the electrical system and provide an input signal thereto. A power supply is interconnected between an internal power source and the conductive probe element. Processors are electrically connected to the conductive probe element and configured to manipulate the input signal provided to the electrical system and receive an output signal in response to the input signal. The output signal is representative of at least one of the parameters of the electrical system. A display device is configured to display a reading of the output signal which is representative of the parameter.

15 Claims, 3 Drawing Sheets

Related U.S. Application Data

(60) Provisional application No. 62/087,165, filed on Dec. 3, 2014.

(51) Int. Cl.
*G01R 1/067* (2006.01)
*G01R 15/12* (2006.01)
*G01R 31/44* (2006.01)
*G01R 1/04* (2006.01)

(52) U.S. Cl.
CPC ................ *G01R 31/44* (2013.01); *G01R 1/04* (2013.01); *G01R 31/026* (2013.01)

(58) Field of Classification Search
CPC ............ G01R 31/3682; G01R 1/06788; G01R 1/06716; G01R 1/06722; G01R 1/06711; G01R 1/06783; G01R 1/06766; G01R 1/06777; G01R 1/22; G01R 1/04; G01R 15/12; G01R 11/04; G01R 19/155; G01R 19/145; G01R 27/02; G01R 15/14; G01R 15/18; G01R 15/125
See application file for complete search history.

(56) References Cited

U.S. PATENT DOCUMENTS

| | | | |
|---|---|---|---|
| 5,250,893 A * | 10/1993 | Gambill | G01R 15/09 324/115 |
| 5,367,250 A | 11/1994 | Whisenand | |
| 5,511,108 A * | 4/1996 | Severt | G01R 15/12 379/1.01 |
| 5,572,117 A | 11/1996 | Yoon | |
| 5,604,436 A | 2/1997 | Henritzy et al. | |
| 5,640,155 A * | 6/1997 | Springer | G01R 15/125 324/156 |
| 5,712,420 A * | 1/1998 | Schaffer | G01M 13/02 73/1.72 |
| 6,028,423 A * | 2/2000 | Sanchez | G01R 31/002 324/750.26 |
| 7,184,899 B2 | 2/2007 | Cruz | |
| 7,675,300 B2 | 3/2010 | Baur et al. | |
| 7,714,569 B2 * | 5/2010 | Li | H01R 31/06 324/756.05 |
| 2002/0004694 A1 | 1/2002 | McLeod et al. | |
| 2002/0097056 A1 | 7/2002 | Blades | |
| 2003/0195713 A1 | 10/2003 | McTigue | |
| 2004/0012379 A1 | 1/2004 | Van Deursen et al. | |
| 2004/0041793 A1 | 3/2004 | Redding et al. | |
| 2004/0150383 A1 | 8/2004 | Blais | |
| 2005/0200346 A1 | 9/2005 | Novak et al. | |
| 2006/0145714 A1 | 7/2006 | Cruz | |
| 2006/0232280 A1 | 10/2006 | Chen et al. | |
| 2010/0060303 A1 | 3/2010 | Beckling | |
| 2011/0156696 A1 | 6/2011 | Cheek et al. | |
| 2012/0119726 A1 | 5/2012 | Kuhwald et al. | |
| 2013/0033253 A1 * | 2/2013 | Liu | G01R 1/04 324/115 |
| 2013/0221973 A1 | 8/2013 | Whisenand et al. | |
| 2014/0084902 A1 | 3/2014 | Baikie | |

\* cited by examiner

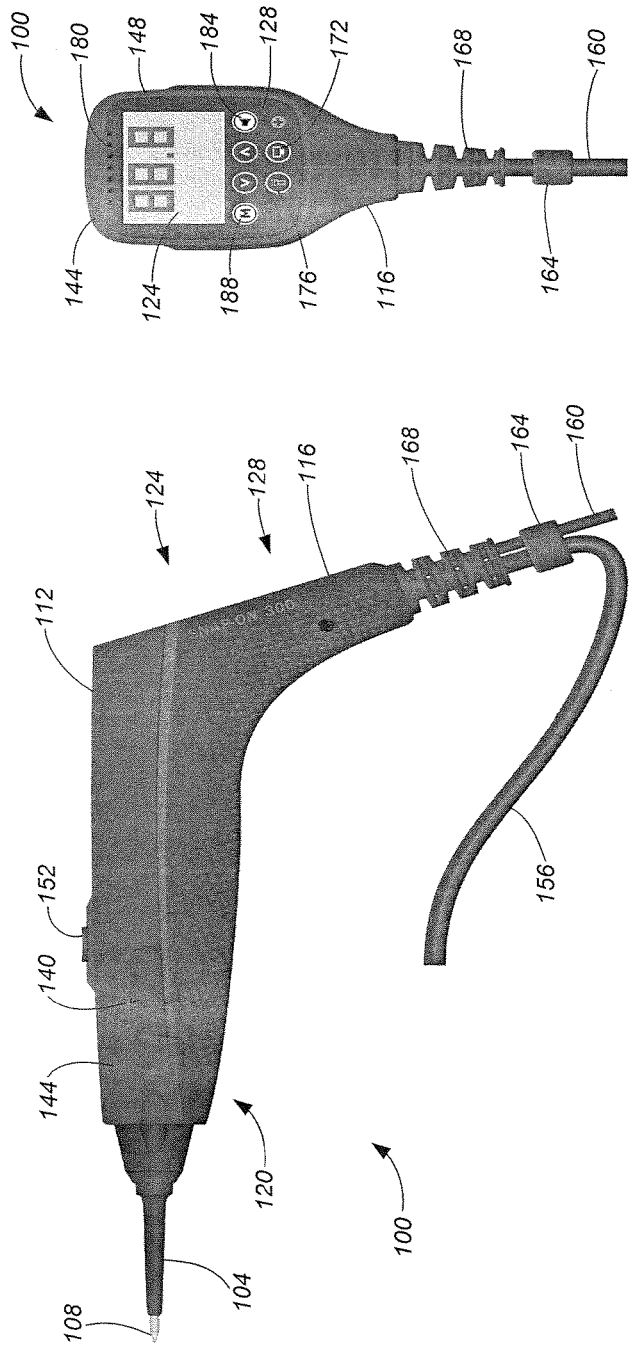
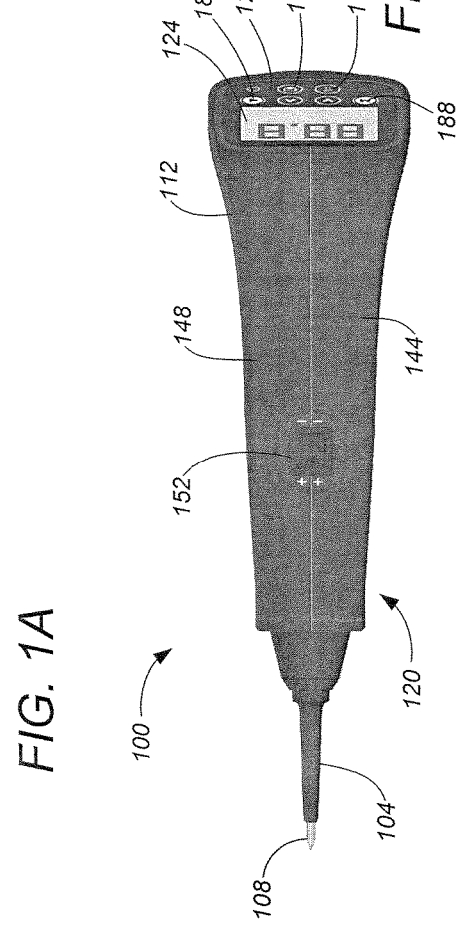
FIG. 1A
FIG. 1B
FIG. 1C

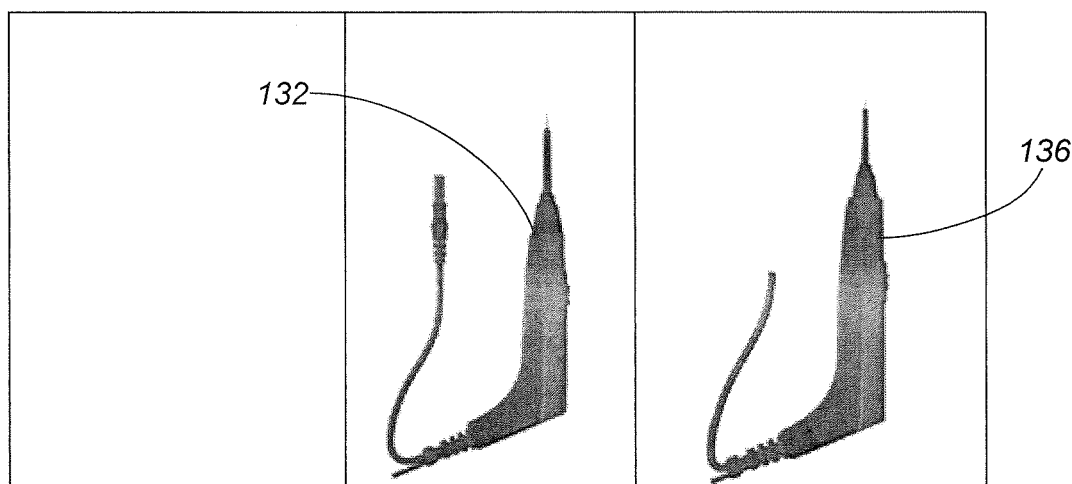

| Model | Snap-On 150 | Snap-On 300 |
|---|---|---|
| Min Operating Voltage | 6 VDC | 6VDC |
| Max Operating Voltage | 24 VDC | 48 VDC |
| Voltage Measurement | 0-70 VDC/VAC | 0-99.9 VDC/VAC |
| Max Continuous Load | 8 Amps | 25 Amps |
| Max Intermittent Load | 25 Amps for 2 Sec. | 25 Amps for Continuous |
| Ohms Measurement | Yes | 0.001 Ohms – 15 Meg Ohms |
| Amps Measurement | No | 0.001 Amps – 99.9 Amps |
| Volt Meter | Yes | Yes |
| Volt Meter Min/Max | Yes | Yes |
| Peak-to-Peak | No | Yes |
| Peak-to-Peak Min/Max | No | Yes |
| K-type Temp | Yes | Yes |
| Built In Battery Tester | Yes | Yes |
| LCD Display | Yes (TN Color) | Yes (TFT) |
| Load Test (Hot Shot) | No | Yes |
| Bad Ground Indicator | Yes | Yes |
| Continuity Tester | Yes | Yes |
| 4mm Std. Banana Jack | Yes | Yes |
| Relay & Component Tester | Yes | Yes |
| Short Circuit Indication | Yes | Yes |
| High Impedance Test Light | Yes | Yes |
| Power Cable Swappable | No | Yes |
| Graphing Display | No | Yes |
| Vibration Feedback | No | Yes |
| Environmental Rating | IP67 | IP67 |

*FIG. 2*

DIAGNOSTIC CIRCUIT TEST DEVICE

PRIORITY

This application claims the benefit of and is a continuation of U.S. patent application Ser. No. 14/955,557, filed Dec. 1, 2015, which claims the benefit of and priority to U.S. Provisional Application, entitled "Diagnostic Circuit Test Device," filed on Dec. 3, 2014, having application Ser. No. 62/087,165.

FIELD

The field of the invention generally relates to electrical measuring devices. More particularly, the field of the invention relates to a diagnostic circuit test device adapted to apply power to an electrical system and perform multiple measurements upon the electrical system in a powered state.

BACKGROUND

Motor vehicles such as automobiles and trucks are becoming increasingly technologically sophisticated requiring a correspondingly more sophisticated set of test equipment for maintenance and diagnostic testing. Much of the increased complexity of motor vehicles is due in part to the increased complexity of electrical circuitry and systems incorporated therein. Troubleshooting and diagnosing problems with such electrical systems requires the use of a wide array of complex test equipment.

Such test equipment may include, for example, devices commonly referred to as multi-meters that are configured to measure various electrical parameters, such as resistance, voltage, current, and the like. Other diagnostic testing that is typically performed on motor vehicle electrical systems includes logic probes which measure and detect the presence and polarity of voltages, as well as determining continuity in electrical circuits.

One drawback, however, is that conventional logic probes typically are incapable of measuring specific voltage levels. Another drawback associated with prior art test equipment regards an inability to test electrical systems in a powered state. More specifically, many conventional multi-meters and logic probes are incapable of placing circuitry into an operational mode for the purpose of diagnosing problems with the circuitry. For example, certain electrical devices in an electrical system of an automobile having a non-operational engine cannot be tested in the normal operating mode. It will be appreciated, however, that it is desirable to test such devices in the operational mode in order to ascertain specific problems that can only be diagnosed when such devices are operating. For instance, a fan motor of a motor vehicle may require that the engine of the vehicle is operating in order to provide current to the fan motor. Unfortunately, unless power is provided to the fan motor by way of a separate power source, it is impossible to test and diagnose certain problems with the fan motor.

It will be appreciated that there exists a need in the art for a diagnostic circuit test device that is capable of providing power to an electrical system in order to test electrical systems in an active or powered state. Furthermore, there exists a need in the art for a diagnostic circuit test device that combines other test features, such as logic probe diagnostic testing, into a single unit. In addition, there exists a need in the art for a diagnostic circuit test device capable of combining key measurement functions into a single instrument in order to the accelerate diagnosis of electrical problems.

Finally, there exists a need in the art for a diagnostic circuit test device that is hand held, and that is easy to use and which contains a minimal number of parts and is of low cost.

SUMMARY OF THE INVENTION

An apparatus is provided for a diagnostic circuit test device having multi-meter functionality and being adapted to provide current sourcing to an electrical system for selective measurement of a plurality of parameters thereof in at least one of powered and unpowered states. The diagnostic circuit test device comprises a conductive probe element configured to be placed into contact with the electrical system and provide an input signal thereto. A power supply is interconnected between an internal power source and the conductive probe element. One or more processors are electrically connected to the conductive probe element and configured to manipulate the input signal provided to the electrical system and receive an output signal in response to the input signal. The output signal is representative of at least one of the parameters of the electrical system. A display device is electrically connected to the one or more processors and configured to display a reading of the output signal which is representative of the parameter. The diagnostic circuit test device is configured to allow for selective powering of the electrical system upon energizing of the conductive probe element during measurement of the parameters.

In an exemplary embodiment, an apparatus for a diagnostic circuit test device having multi-meter functionality and being adapted to provide current sourcing to an electrical system for selective measurement of a plurality of parameters thereof in at least one of powered and unpowered states comprises a conductive probe element configured to be placed into contact with the electrical system and provide an input signal thereto; a power supply interconnected between an internal power source and the conductive probe element; one or more processors electrically connected to the conductive probe element and configured to manipulate the input signal provided to the electrical system and receive an output signal in response to the input signal, the output signal being representative of at least one of the parameters of the electrical system; and a display device electrically connected to the one or more processors and configured to display a reading of the output signal, the reading being representative of the parameter; wherein the diagnostic circuit test device is configured to allow for selective powering of the electrical system upon energizing of the conductive probe element during measurement of the parameters.

In another exemplary embodiment, the diagnostic circuit test device is configured to be switchable between one of an active mode and a passive mode, the active mode defined by measurement of the parameters during powering of the electrical system, and the passive mode defined by measurement of the parameters without powering the electrical system. In another exemplary embodiment, further comprises a piezo element electrically connected to the one or more processors, wherein the one or more processors are configured to cause the piezo element to generate an audible tone during measurement of at least one of the parameters. In another exemplary embodiment, the display device is a liquid crystal display.

In another exemplary embodiment, further comprises a pair of power leads configured to connect the test device to an external power source. In another exemplary embodiment, further comprises a ground lead configured to be connected to a ground source. In another exemplary embodiment, further comprises a keypad configured to allow for switching between measurement modes of the parameters. In another exemplary embodiment, the parameters measurable by the test device include at least one of circuit continuity, resistance, voltage, current, load impedance, and frequency.

In another exemplary embodiment, further comprises at least one signal lamp connected to the one or more processors and configured to illuminate in response to a continuity measurement. In another exemplary embodiment, the at least one signal lamp is configured as a light emitting diode (LED). In another exemplary embodiment, further comprises at least one illumination lamp connected to the one or more processors and configured to illuminate an area adjacent the conductive probe element. In another exemplary embodiment, the illumination lamp is configured as a light emitting diode (LED).

In another exemplary embodiment, the one or more processors are configured to cause a periodic energizing of the conductive probe element for powering the electrical system at predetermined intervals for testing a relay switch. In another exemplary embodiment, further comprises a keypad configured to allow for switching between measurements of the parameters. In another exemplary embodiment, the diagnostic circuit test device is configured to enable selective powering of the electrical system upon energizing of the conductive probe element during measurement of the parameters, and the one or more processors are configured to cause periodic energizing of the conductive probe element for powering the electrical system at predetermined intervals for testing an electro-mechanical device. In another exemplary embodiment, the electro-mechanical device is a relay switch. In another exemplary embodiment, the one or more processors are configured to cause a speaker and the display device to simultaneously and respectively generate an audible signal and display a reading of the output signal.

BRIEF DESCRIPTION OF THE DRAWINGS

The drawings refer to embodiments of the present disclosure in which:

FIG. 1A illustrates a side view of an exemplary embodiment of a diagnostic circuit test device in accordance with the present disclosure;

FIG. 1B illustrates a proximal view of an exemplary embodiment of a diagnostic circuit test device, according to the present disclosure;

FIG. 1C illustrates a top view of an exemplary embodiment of a diagnostic circuit test device in accordance with the present disclosure;

FIG. 2 is a table illustrating a comparison of functions associated with a first embodiment and a second embodiment of the diagnostic circuit test device illustrated in FIGS. 1A-1C in accordance with the present disclosure.

Figure 3:
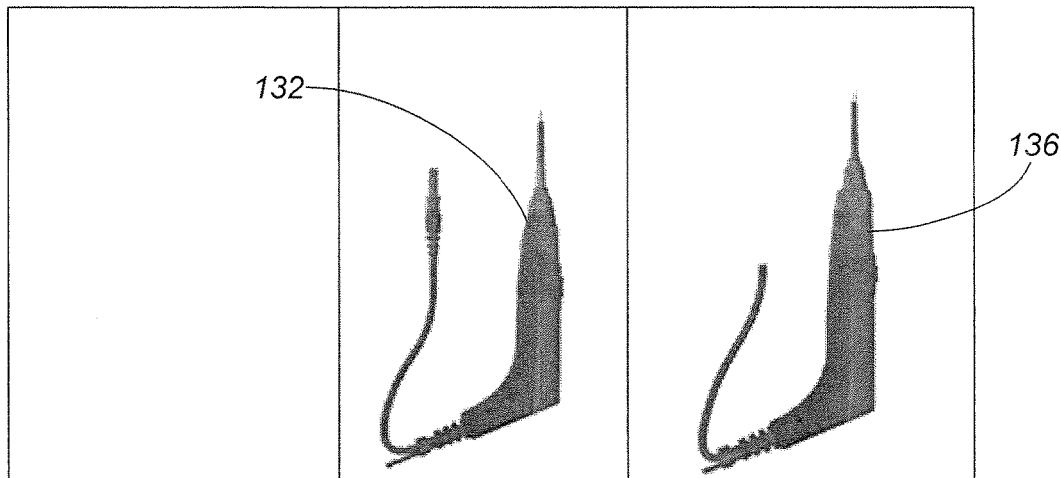
FIG. 3 is a table illustrating a comparison of specifications associated with the first embodiment and the second embodiment of the diagnostic circuit test device illustrated in FIGS. 1A-1C, according to the present disclosure.

While the present disclosure is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the present disclosure.

DETAILED DESCRIPTION

In the following description, numerous specific details are set forth in order to provide a thorough understanding of the present disclosure. It will be apparent, however, to one of ordinary skill in the art that the invention disclosed herein may be practiced without these specific details. In other instances, specific numeric references such as "first circuit," may be made. However, the specific numeric reference should not be interpreted as a literal sequential order but rather interpreted that the "first circuit" is different than a "second circuit." Thus, the specific details set forth are merely exemplary. The specific details may be varied from and still be contemplated to be within the spirit and scope of the present disclosure. The term "coupled" is defined as meaning connected either directly to the component or indirectly to the component through another component. Further, as used herein, the terms "about," "approximately," or "substantially" for any numerical values or ranges indicate a suitable dimensional tolerance that allows the part or collection of components to function for its intended purpose as described herein.

In general, the present disclosure describes an apparatus for a diagnostic circuit test device having multi-meter functionality and being adapted to provide current sourcing to an electrical system for selective measurement of a plurality of parameters thereof in at least one of powered and unpowered states. The diagnostic circuit test device comprises a conductive probe element configured to be placed into contact with the electrical system and provide an input signal thereto. A power supply is interconnected between an internal power source and the conductive probe element. One or more processors are electrically connected to the conductive probe element and configured to manipulate the input signal provided to the electrical system and receive an output signal in response to the input signal. The output signal is representative of at least one of the parameters of the electrical system. A display device is electrically connected to the one or more processors and configured to display a reading of the output signal which is representative of the parameter. The diagnostic circuit test device is configured to allow for selective powering of the electrical system upon energizing of the conductive probe element during measurement of the parameters.

FIGS. 1A-1C illustrate an exemplary embodiment of a diagnostic circuit test device 100 that is specifically adapted to provide current sourcing to an electrical system while also providing multi-meter functionality for selective measurement of a plurality of parameters of the electrical system. Advantageously, the diagnostic circuit test device 100 is uniquely configured to facilitate collecting data on active, even on relatively high-current, electrical systems. More specifically, the diagnostic circuit test device 100 is specifically configured to enable access to current flow through the electrical system and includes a capability to characterize loaded impedance, wave form (e.g., fluctuation, frequency/speed), and current drain, in addition to various other functions commonly performed by multi-meters, such as measurements of voltage, current, and resistance within circuits. In some embodiments, the unique configuration of the diagnostic circuit test device 100 eliminates a need for clip-on current sensors as is often required with prior art electrical test devices. Further, the unique configuration of the diagnostic circuit test device 100 eliminates a need for a separate power cable and probe element connection.

FIG. 1A illustrates a side view of the diagnostic circuit test device 100. FIG. 1B illustrates a proximal view of the diagnostic circuit test device, and FIG. 1C illustrates a top view of the diagnostic circuit test device. As shown in FIGS. 1A-1C, the diagnostic circuit test device 100 comprises a conductive probe element 104 with a distal probe tip 108, both of which supported by, and protruding distally from, a housing 112. The housing 112 comprises a handle portion 116 and an elongate portion 120. As best illustrated in FIG. 1A, the handle portion 116 is configured to be suitably grasped in a hand while directing the elongate member 120 in desired directions so as to contact the distal probe tip 108 with various electrical components for which measurements are desired. It will be appreciated that the housing 112 serves as a protective envelope for at least a power supply, an internal power source, one or more processors, a proximal display device 124, as well as various other internal components such that the diagnostic circuit test device 100 is configured to allow for selective powering of the electrical system under test upon energizing the conductive probe element 104 while measuring parameters of the electrical system.

The conductive probe element 104 is configured to be placed into contact with the electrical system under test, as well as providing an input signal to the electrical system. In the embodiment illustrated in FIGS. 1A-1C, the power supply is interconnected between the internal power source and the conductive probe element 104. It is envisioned that the internal power source is configured as an internal battery within the housing 112, and interconnected between the power supply and the conductive probe element 104. Preferably, the internal battery is rechargeable by way of a charging cable which may be connected to an AC source, such as a wall electrical socket, and received into a charging port of the housing 112. In some embodiments, the internal battery may be rechargeable by way of a DC source, such as a motor vehicle battery. Still, in some embodiments, the internal battery may be rechargeable by way of the charging port implemented as a USB interface which receives a USB cable from a personal computer (PC). It will be appreciated that circuitry suitable for charging the internal battery is interconnected between the charging port and the internal battery. In some embodiments, an external power source may be used either in addition to or alternatively to the internal power source. In some embodiments, the external power source may be configured as a battery of a motor vehicle which includes the electrical system under test. In other embodiments, however, the external power source may be configured in a variety of embodiments other than a motor vehicle battery.

In some embodiments, the power supply may be connected to a reset control, such as a microprocessor reset control comprised of circuitry that provides a reset signal to the one or more processors under conditions wherein the operating voltage may be out of tolerance. Further, it is envisioned that the power supply preferably is configured to provide a voltage regulated output for all circuitry within the diagnostic circuit test device 100. As will be appreciated, the voltage regulated output preferably is provided independently of any input signal to the electrical system under test.

The one or more processors preferably are electrically connected to the conductive probe element 104 and are configured to manipulate the input signal provided to the electrical system, as well as receive an output signal in response to the input signal. It will be appreciated that the output signal is representative of the measurement of at least one of the parameters of the electrical system. In manipulating and controlling the measurement functions of the diagnostic circuit test device 100, the one or more processors may be provided with an executable software program configured to provide control of the various measurement functions of the diagnostic circuit test device 100. Thus, the one or more processors control all the functions of the diagnostic circuit test device 100.

As best shown in FIG. 1B, the proximal display device 124 of the diagnostic circuit test device 100 preferably is of the LCD variety, although other implementations of the display device 124 may be contemplated. The proximal display device 124 is electrically connected to the one or more processors and is configured to display a reading of the output signal which is extracted from the electrical system under test. It will be appreciated that the reading is representative of the parameter being measured. In some embodiments, an audible device may be included within the diagnostic circuit test device 100 for providing an audible indication of certain operating parameters of the electrical system under test. For example, in some embodiments the audible device may comprise a piezo element, such as a piezo disk, which operates as a speaker for providing information regarding continuity measurements and voltage polarity of the electrical system.

In some embodiments, the diagnostic circuit test device 100 may be configured to automatically switch between one of an active mode and a passive mode wherein the active mode is defined by measurement of the parameters of the electrical system during powering thereof As was previously mentioned, the power is supplied to the electrical system by way of the internal power source, such as a battery, or other equivalent power source, which is directed through the power supply and passed into the conductive probe element 104. In this manner, the conductive probe element 104 may transfer current into the electrical system under test. The passive mode is defined by measurement of the parameters of the electrical system without the application of power to the electrical system. The application of power may be controlled by way of a keypad 128, illustrated in FIG. 1B, which is connected to the one or more processors.

In some embodiments, the display device 124 may be configured to indicate whether the test device 100 is in the passive mode or the active mode. In some embodiments, the diagnostic circuit test device 100 may include a speaker driver which is connected to a speaker (i.e., the piezo element) and is configured to handle the formatting and converting of signals from the one or more processors, such that the speaker may be operated as necessary. Similarly, a display driver is envisioned to be connected between the one or more processors and the display device 124, and configured to handle formatting and converting of signals from the one or more processors into a suitable format for display by way of the display device 124.

In some embodiments, the diagnostic circuit test device 100 may include a plurality of functions or features, and thus the diagnostic circuit test device 100 may operate within a plurality of modes, whereby the diagnostic circuit test device 100 may be utilized to perform tests of the electrical system. FIGS. 2-3 are tables illustrating a comparison of a multiplicity of functions and specifications associated with a first embodiment 132 and a second embodiment 136 of the diagnostic circuit test device 100 illustrated in FIGS. 1A-1C. As will be appreciated, therefore, in some embodiments the diagnostic circuit test device 100 may operate as a dual continuity tester, a load impedance detector, a logic probe detector and generator, and a power output driver with over current protection, as well as performing frequency and totalizer measurements, voltage measurements, resistance measurements, and current measurements. In some embodiments, the voltage measurement functionality and the current measurement functionality may each include analog-to-digital conversion mechanisms. Furthermore, in some embodiments the diagnostic circuit test device 100 may simultaneously measure current and voltage of the electrical system due to the application of current sourcing into the electrical system under test.

It should be noted that although each of the functions is discussed herein as a separate function, componentry may be shared there between for facilitating any particular measurement of the electrical system. Furthermore, as discussed above, it should be understood that the one or more processors control the functions of the diagnostic circuit test device 100 during testing. It should also be noted that the above-mentioned dual continuity tester functionality may be used in conjunction with the current source provided by the probe when energized by the power supply and the internal power source. Such operation of the current source provided by the probe is similar to that which is disclosed in U.S. Pat. No. 7,184,899, entitled "Energizable Electrical Test Device for Measuring Current and Resistance of an Electrical Circuit," filed on Jan. 5, 2005, and disclosed in U.S. Pat. No. 5,367,250, entitled "Electrical Tester with Electrical Energizable Test Probe", filed on Dec. 22, 1992, the entirety of each of said patents being incorporated herein by reference and made a part of the present disclosure. It will be appreciated that the operation of the dual continuity tester of the diagnostic circuit test device 100, in combination with the display device 124 and a relay test port 140, provides for an extremely convenient means for testing the functionality of multi-pole relays. More specifically, the dual continuity tester is configured to allow testing of multiple contacts wherein a coil resistance of the relay may be easily measured. It will be appreciated that many other test configurations may be obtained.

As stated above, the current sourcing functionality of the diagnostic circuit test device 100 is similar to that shown and disclosed in U.S. Pat. Nos. 7,184,899 and 5,367,250. The dual continuity tester, when coupled with the measurement functions of the diagnostic circuit test device 100 and the relay test port 140, enables testing of contact switches in relay devices. For example, in an electrical system having two relays, the dual continuity tester provides for the capability to determine which one of the two relays is activated and/or which is deactivated. In some embodiments, the dual continuity tester may be used to check the status and operability of multiple contacts such as in a multi-pole/multi-contact relay or switch.

In some embodiments, the load impedance detector function of the diagnostic circuit test device 100 facilitates measurements of the magnitude of a voltage drop, such as when testing electrical junctions in an electrical circuit. As will be appreciated, the load impedance detector function is useful for testing power feed circuits that may have loose or corroded connections. As will be described in greater detail below, when the conductive probe element 104 is connected to the electrical system under test, the impedance of the electrical system may be tested and the diagnostic circuit test device 100 may provide an indication, either audibly by way of an internal speaker and/or visually by way of the display device 124, such as when a set point (i.e., a predetermined voltage level) is above a specified voltage limit.

The logic probe generator and detector function of the diagnostic circuit test device 100 comprises at least one circuit that creates a sequence for outputting into a device of the electrical system by way of the conductive probe element 104. For example, a digital pulse train may be input into a device of the electrical system with the digital pulse train inserted into a terminal of a device under test in order to assess communication between components of the electrical system (e.g., between an odometer in communication with a control unit of a motor vehicle). In some embodiments, the logic probe generator and detector function further provides the diagnostic circuit test device 100 with a capability to measure signal levels, as well as frequency. High and low logic levels may be generated, as well as pulse trains at various frequencies.

The frequency and totalizer measurement function of the diagnostic circuit test device 100 facilitates assessing a rate of voltage or current fluctuation in the electrical system under test, and accumulating occurrences of a particular state over time. The frequency and totalizer measurement functionality enables processing of signal transitions of a waveform in order to extract the frequency, revolutions per minute (RPM), duty cycle, and number of pulses from a signal. The frequency aspect of the frequency and totalizer measurement function allows for determining the frequency, or RPM, or duty cycle component of the electrical system. The totalizer aspect of the frequency and totalizer measurement function accumulates pulses, or cycles, and enables the diagnostic circuit test device 100 to measure and check for intermittent output signals from the electrical system under test. In some embodiments, the frequency and totalizer measurement function further provides a means for checking switches in an electrical system by providing a means for measuring a number of times that a contact within a switch bounces, for example, such as may occur in a relay switch.

The voltage measurement function enables high speed voltage measurements in the electrical system. The voltage measurement function enables the diagnostic circuit test device 100 to sample and detect positive and negative peaks of a signal, as well as detecting and measuring an average of the signals, and displaying results of the signal readout on the display device 124. It will be appreciated that the voltage measurement function simplifies voltage drop tests, voltage transient tests and voltage fluctuation, or ripple tests.

The power output driver with over current protection function provides a buffer stage, or a transistor, for the diagnostic circuit test device 100, such that the power output driver with over current protection regulates the amount of current that may be passed from the power supply to the conductive probe element 104 and ultimately into the electrical system under test. In addition, in some embodiments the power output driver may establish an appropriate drive impedance and protect the diagnostic circuit test device 100 from damage due to electrical transients.

The current measurement function facilitates high speed current measurements by way of the diagnostic circuit test device 100, such as sampling and detection of current consumed in a load provided in the input signal which is passed into the electrical system. Such consumed current preferably is displayed on the display device 124.

Referring again to FIGS. 1A-1C, it is envisioned that the housing 112 contains at least one circuit board assembly comprising a circuit board whereon the one or more processors and the display device 124, along with the power supply, the reset control, and the speaker and display drivers, may be enclosed and interconnected. As best shown in FIG. 1C, the housing 112 comprises a left shell 144 and a right shell 148 which may be fastened to one another, such as by mechanical fasteners. It is envisioned that in some embodiments, the left and right shells 144, 148 of the housing 112 may be configured to provide a hang loop extending out of the housing 112, whereby the diagnostic circuit test device 100 may be attached to, or hung from, fixed objects such as a cable, or a hook.

As can be seen in FIG. 1A, the left shell 144 of the housing 112 includes the relay test port 140 which also comprises a USB interface, whereby the diagnostic circuit test device 100 may be interfaced with a personal computer (PC). Activation and deactivation of the USB interface may be provided by means of a button 172 on the keypad 128, which is electrically connected to the one or more processors located on the circuit board, disposed at a location adjacent to the display device 124. As best shown in FIG. 1C, the diagnostic circuit test device 100 further comprises a polarity switch 152 whereby the conductive probe element 104 may be switched between one of positive and negative electrical polarities.

At a bottom end of the handle portion 116 is an aperture formed in the housing 112 through which a power cable 156 protrudes. In some embodiments, the power cable 156 is configured with a pair of power leads (not shown), preferably one positive lead and one negative lead. In the embodiment illustrated in FIGS. 1A-1C, a ground lead 160 is also included in the power cable 156 extending out of the bottom end of the handle portion 116. Both the power cable 156 and the ground lead 160 are configured as insulated conductors. The power cable 156 and the ground lead 160 are encased in a cable sheathing which passes through an annular shaped bushing 164 and a strain relief bushing 168 coaxially fitted within the aperture formed in the handle portion 116 so as to prevent undue strain on the power cable 156.

A distal end of the power cable 156 may comprise any of a variety of electrical clips, or fasteners, such as high power alligator clips, disposed on extreme ends of each one of the pair of power leads. Where an external power source is used, such as by way of non-limiting example, a motor vehicle battery, the alligator clips may be configured to facilitate connection thereto. In this regard, the negative one of the power leads may be provided in a black-colored alligator clip while the positive one of the power leads may be provided with a red-colored alligator clip. Disposed at an end of the ground lead 160 may also be an alligator clip to facilitate connection to a ground source. It should be understood, however, that the above-discussed internal battery of the diagnostic circuit test device 100 preferably operates as an internal power source to the power supply and the conductive probe element 104, and thus the power leads need not be connected to an external power supply.

It will be appreciated that the power cable 156 is electrically connected to the circuit board assembly within the housing 112. As was previously mentioned, the internal battery comprises an internal power source that is connected to the power supply which is integrated with the circuit board assembly and which is ultimately connected to the conductive probe element 104 extending distally out of the elongate portion 120. In some embodiments, however, the external power source may be connected by way of the power cable 156 to the power supply, which is integrated with the circuit board assembly and which is ultimately connected to the conductive probe element 104. As mentioned above, the conductive probe element 104 comprises the distal probe tip 108 on an extreme end thereof. Advantageously, the conductive probe element 104 and the distal probe tip 108 are configured to be removable from the diagnostic circuit test device 100 by way of a probe jack (not shown), such that various electrical testing accessories may be inserted into the probe jack for checking the electrical system under test.

In some embodiments, a distal end of the elongate portion 120 comprises openings or apertures formed within the housing 112 through which illumination lamps at least partially extend. The illumination lamps may optionally be provided for illuminating an area adjacent to the distal probe tip 108. It is envisioned that four apertures and illumination lamps may be utilized, although any number may be provided. It is contemplated that the illumination lamps may preferably be configured as light emitting diodes (LEDs). Activation and deactivation of the illumination lamps may be provided by means of a button 176 on the keypad 128, which is electrically connected to the one or more processors located on the circuit board, disposed at a location adjacent to the display device 124.

As mentioned above, mounted within the housing 112 is the display device 124 which may be configured as a liquid crystal display (LCD). In order to protect the display device 124 as well as the interior of the housing 112, a display overlay may be included and is preferably disposed generally flush or level with the exterior of the housing 112. In some embodiments, the display overlay may be configured to form a protective barrier for the keypad 128 integrated into the diagnostic circuit test device 100.

As was earlier mentioned, the keypad 128 enables manipulation of the one or more processors for controlling functionality of the diagnostic circuit test device 100. The keypad 128 may be comprised of any number of keys, but preferably comprises eight (8) buttons for operation of the diagnostic circuit test device 100. The eight (8) buttons of the keypad 128 may be configured to allow for selective switching between different measurement modes of the diagnostic circuit test device 100.

In some embodiments, the keypad 128 may facilitate the configuration of measuring and displaying various parameters of AC voltage and DC voltage measurements, resistance of the electrical circuit, current flowing within the electrical circuit, the frequency of signals, and the like. More specifically, the diagnostic circuit test device 100 may be manipulated such that parameters measurable by the diagnostic circuit test device 100 include at least one of the following: circuit continuity, resistance, voltage, current, load impedance, and frequency, RPM and pulse counting. In some embodiments, further measurement modes may be facilitated through manipulation of the keypad 128. For example, frequency, RPM, duty cycle and totalizer measurements may be performed upon an electrical circuit in a test. In some embodiments, signal level and frequency may be measured, as well as testing of impedance.

It will be appreciated that the circuit board assembly may comprise at least one fuse which partially protrudes through apertures formed in the housing 112. In some embodiments, the fuse may be incorporated into the diagnostic circuit test device 100 as a safety precaution to prevent damage to the circuitry of the test device 100. In some embodiments, the diagnostic circuit test device 100 may comprise a circuit breaker, such as an electronic circuit breaker, which may comprise configurable trip levels and a manual circuit breaker reset.

As mentioned above, some embodiments of the diagnostic circuit test device 100 may comprise an audible device, such as the piezo element, configured for providing an audible indication of certain operating parameters of the electrical system under test. As best illustrated in FIG. 1B, the keypad 128 comprises a button 184 whereby operation of the piezo element may be controlled. It will be appreciated that the piezo element is incorporated into the circuit board assembly of the diagnostic circuit test device and is disposed within the housing 112 is a position suitable for providing the audible indications. In the embodiment illustrated in FIG. 1B, speaker holes 180 are formed in the housing 112, above the display device 124, so as to allow for transmission of audible tones generated by the piezo element, such as may occur during the variously configurable modes of operation of the diagnostic circuit test device 100.

In some embodiments, the diagnostic circuit test device 100 may comprise an additional lamp configured as an LED and which may protrude through an aperture formed in the housing 112. It is envisioned that such LED may be connected to the one or more processors and may provide a means to indicate whether power is being applied to the diagnostic circuit test device 100. Alternatively, or in addition to, the LED protruding through the housing 112 may also be configured as a power-good indicator which becomes deactivated to indicate the occurrence of a blown fuse.

As was earlier discussed, the diagnostic circuit test device 100 may be operated in either one of the passive mode or the active mode. The passive mode is defined by measurements of the electrical system with no power being supplied thereto by the conductive probe element 104. The active mode is defined by measurement of parameters of the electrical system during application of power, such as from the internal power source or an external power source, through the conductive probe element 104 and into the electrical system. When the diagnostic circuit test device 100 is operating as a dual continuity tester, as discussed previously, the dual continuity tester may use the current source provided by either the internal power source, or the external power source, for inputting current into the electrical system during continuity testing. Thus, in the active mode, wherein power is supplied to the electrical system under test, the continuity of a particular portion of the electrical system may be verified by way of the diagnostic circuit test device 100.

In some embodiments, load impedance detection functionality may be facilitated such that the magnitude of a voltage drop within an electrical system, such as when testing electrical junctions in power feed circuits that may have loose or corroded connections. The electrical system under test may be measured with differences there between being assessed and displayed on the display device 124. In some embodiments, the logic probe generator and detection functionality, as was previously discussed, facilitates testing for high logic, low logic, and pulsing logic signals. Thus, in some embodiments the diagnostic circuit test device 100 is configured to allow forcing of a signal into the electrical system under test with manipulation of multiple functions of the logic detection functionality, such that an appropriate input signal may be input into the electrical system under test.

The frequency and totalizer measurement functionality facilitates measuring signals from the electrical system, as well as providing the capability for entering a "divide ratio", which may be equivalent to a number of cylinders of an engine within a motor vehicle being tested. In this manner, the diagnostic circuit test device 100 may measure the revolutionary speed at which a motor vehicle engine is operating. In some embodiments, rates of voltage or current fluctuation may be measured and signal transition components of a wave form may be analyzed to extract frequency, duty cycle and number of pulses. Regarding the voltage measurement functionality, the diagnostic circuit test device 100 may measure and display average voltage similar to that performed, or measured, by a standard volt meter, as well as measurement and display of positive peak voltage and negative peak voltage. Importantly, the measurement of negative peak voltage facilitates measuring and analyzing voltage of an alternator having a faulty diode.

In some embodiments, the diagnostic circuit test device 100 may be operated as a digital volt meter capable of performing a voltage drop test and battery load testing, as well as transient voltage testing. Further, in some embodiments, the combination of the power output drivers with current measurement capability enables the diagnostic circuit test device 100 to measure current and voltage simultaneously. The diagnostic circuit test device 100 may be placed in the active mode and then placed in a "latched" or permanent operation mode wherein a constant supply of power is provided through the conductive probe element 104 into the electrical system under test. In some embodiments, the diagnostic circuit test device 100 may be placed in a "momentary" power mode wherein power may be supplied on an as-requested basis due to manual manipulation of a button 188 of the keypad 128.

In some embodiments, the one or more processors may be configured to cause periodic energizing of the conductive probe element 104 for powering the electrical system under test at predetermined intervals for testing an electro-mechanical device that is part of the electrical system under test. Examples of electro-mechanical devices that may be tested in this manner include, but are not limited to, relay switches, solenoids, motors, and the like. Power may be provided to the electrical system under test on an automatic intermittent basis at predetermined intervals such as, for example, at one-second intervals. Advantageously, the ability to provide power in such varying modes allows for testing the proper operation of electro-mechanical devices, such as relay switches, as well as for tracing locations of such electro-mechanical devices. By using the internal power source to intermittently provide current into the electrical system through the conductive probe element 104, a user may more easily track the location of a faulty relay switch by listening for a clicking sound as power is intermittently applied thereto. It will be appreciated that such a method for checking for faulty relay switches may be especially valuable in detecting relay switches that may be hidden underneath carpeting, seating and/or plastic molding commonly found in automotive interiors.

Moreover, any of various embodiments of the diagnostic circuit test device 100 may comprise any one or more of the above-described features and functions, without limitation. For example, FIG. 2 illustrates a comparison of functions and functions associated with a first embodiment and a second embodiment of the diagnostic circuit test device 100, illustrated in FIGS. 1A-1C. Further, FIG. 3 illustrates a comparison of specifications relating to the first and second embodiments of the diagnostic circuit test device 100. It should be understood, therefore, that a wide variety of functions, features, specifications, and measurement capabilities may be incorporated into embodiments of the diagnostic circuit test device without limitation, and without deviating from the spirit and scope of the present disclosure.

While embodiments of the present disclosure have been described in terms of particular variations and illustrative figures, those of ordinary skill in the art will recognize that the present disclosure is not limited to the variations or figures described. In addition, where methods and steps described above indicate certain events occurring in certain order, those of ordinary skill in the art will recognize that the ordering of certain steps may be modified and that such modifications are in accordance with the variations of the present disclosure. Additionally, certain of the steps may be performed concurrently in a parallel process when possible, as well as performed sequentially as described above. To the extent there are variations of the present disclosure, which are within the spirit of the disclosure or equivalent to the embodiments found in the claims, it is the intent that this patent will cover those variations as well. Therefore, the present disclosure is to be understood as not limited by the specific embodiments described herein, but only by scope of the appended claims.

What is claimed is:

1. A diagnostic circuit test device having multi-meter functionality and being adapted to provide current sourcing to an electrical system for selective measurement of a plurality of parameters thereof in at least one of powered and unpowered states, the diagnostic circuit test device comprising:
   a removable conductive probe element configured to be placed into contact with the electrical system and provide an input signal thereto, wherein various electrical testing accessories may be substituted for the conductive probe element via a probe jack;
   a power supply interconnected between rechargeable internal power source and the conductive probe element, wherein circuitry suitable for charging the internal battery is interconnected between a charging port and the internal power source, the internal battery capable of being charged via a USB interface;
   one or more processors electrically connected to the conductive probe element and configured to manipulate the input signal provided to the electrical system and receive an output signal in response to the input signal, the output signal being representative of at least one of the parameters of the electrical system;
   a housing, comprising a shell that includes a relay test port;
   a display device electrically connected to the one or more processors and configured to display a reading of the output signal, the reading being representative of the at least one of the parameters of the electrical system;
   wherein the diagnostic circuit test device is configured to operate as a dual continuity tester, a load impedance detector, and a power output driver with over current protection; and
   a speaker driver coupled to a speaker that is configured to handle the conversion of signals from the one or more processors to operate the speaker.

2. The diagnostic circuit test device of claim 1, wherein the diagnostic circuit test device is configured to be switchable between one of an active mode and a passive mode, the active mode defined by measurement of the parameters during powering of the electrical system, and the passive mode defined by measurement of the parameters without powering the electrical system.

3. The diagnostic circuit test device of claim 1, wherein the one or more processors are configured to cause a piezo element to generate an audible tone during measurement of at least one of the parameters.

4. The diagnostic circuit test device of claim 1, further comprising a pair of power leads and a ground lead, the power leads being configured to connect the test device to an external power source, and the ground lead being configured to connect to an electrical ground source.

5. The diagnostic circuit test device of claim 1, further comprising a keypad configured to allow for switching between measurement modes of the parameters.

6. The diagnostic circuit test device of claim 1, wherein the parameters measurable by the test device include at least one of circuit continuity, resistance, voltage, current, load impedance, and frequency.

7. The diagnostic circuit test device of claim 1, further comprising at least one signal lamp connected to the one or more processors and configured to illuminate in response to a continuity measurement.

8. The diagnostic circuit test device of claim 7, wherein the at least one signal lamp comprises at least one light emitting diode (LED).

9. The diagnostic circuit test device of claim 1, further comprising at least one illumination lamp connected to the one or more processors and configured to illuminate an area near the conductive probe element.

10. The diagnostic circuit test device of claim 9, wherein the at least one illumination lamp comprises at least one light emitting diode (LED).

11. The diagnostic circuit test device of claim 1, wherein the one or more processors are configured to cause a periodic energizing of the conductive probe element for powering the electrical system at predetermined intervals for testing a relay switch.

12. The diagnostic circuit test device of claim 1, further comprising a keypad configured to allow for switching between measurements of the parameters.

13. The diagnostic circuit test device of claim 1, wherein the diagnostic circuit test device is configured to enable selective powering of the electrical system upon energizing of the conductive probe element during measurement of the parameters, and the one or more processors are configured to cause periodic energizing of the conductive probe element for powering the electrical system at predetermined intervals for testing an electro-mechanical device.

14. The diagnostic circuit test device of claim 13, wherein the electro-mechanical device is a relay switch.

15. The diagnostic circuit test device of claim 1, wherein the one or more processors are configured to cause a speaker and the display device to simultaneously and respectively generate an audible signal and display a reading of the output signal.

* * * * *